United States Patent [19]

Ishikawa

[11] Patent Number: 5,506,547
[45] Date of Patent: Apr. 9, 1996

[54] FREQUENCY MODULATOR HAVING LC OSCILLATOR WITH SWITCHABLE FREQUENCIES

[75] Inventor: Nobuyuki Ishikawa, Kanagawa, Japan

[73] Assignee: Sony Corporation, Tokyo, Japan

[21] Appl. No.: 415,982

[22] Filed: Apr. 4, 1995

[30] Foreign Application Priority Data

Apr. 6, 1994 [JP] Japan .................................. 6-093749

[51] Int. Cl.⁶ .............................. H03C 3/09; H04N 5/922
[52] U.S. Cl. ..................... 332/135; 331/117 R; 331/179;
348/724; 358/330; 360/30; 455/113
[58] Field of Search ..................... 332/117, 135,
332/141; 331/117 R, 117 FE, 167, 179;
348/642, 724; 358/330; 360/30; 455/42,
113

[56] References Cited

U.S. PATENT DOCUMENTS 3,775,555  11/1973  Carlson ................... 348/724

4,533,882  8/1985  Shinbara .................. 332/135

FOREIGN PATENT DOCUMENTS 60-248008  7/1985  Japan .
479163  12/1992  Japan .

*Primary Examiner*—Siegfried H. Grimm
*Attorney, Agent, or Firm*—Ronald P. Kananen

[57] ABSTRACT

A frequency modulation circuit which varies the resonance frequency of an LC resonance circuit, and which corresponds to the frequency modulation conversions of all TV methods with a simple constitution. Each of a plurality of passive element series circuits for varying a time constant of the LC resonance circuit is composed of, for instance, a capacitor and a resistor, which is switched and controlled by connecting to or separating from the LC resonance circuit by a switching circuit such as a transistor. Thereby, the oscillation frequency of the LC resonance circuit can be easily converted to a predetermined frequency.

7 Claims, 9 Drawing Sheets

| FREQUENCY SWITCH | 6.5 (MHz) | 6.0 (MHz) | 5.5 (MHz) | 4.5 (MHz) |
|---|---|---|---|---|
| SW1 | OFF | ON | ON | ON |
| SW2 | OFF | OFF | ON | ON |
| SW3 | OFF | OFF | OFF | ON |

FIG. 4

| FREQUEN-CY SWITCH | 6.5 (MHz) | 6.0 (MHz) | 5.5 (MHz) | 4.5 (MHz) |
|---|---|---|---|---|
| SW1 | OFF | ON | OFF | OFF |
| SW2 | OFF | OFF | ON | OFF |
| SW3 | OFF | OFF | OFF | ON |

FREQUENCY MODULATOR HAVING LC OSCILLATOR WITH SWITCHABLE FREQUENCIES

BACKGROUND OF THE INVENTION

1. Field of the Invention

The present invention relates to a frequency modulation circuit, and is applicable to, for example, the frequency modulation of a sound signal in an RF (radio frequency) modulator used for VTR (video tape recorder), CATV (community antenna television), and the like.

2. Description of the Related Art

Hitherto, in a VTR, for example, a video signal and a sound signal reproduced from a magnetic tape is converted in an RF conversion circuit into a high-frequency signal (RF signal), and supplied to an antenna terminal of a television. A VTR reproduces the video and sound signals converted to this high-frequency signal using the television.

The RF conversion circuit obtains an FM (frequency modulation) sound signal in which a sound carrier signal is frequency-modulated with a reproduced sound signal to a balanced-modulated RF signal with the FM sound signal, and simultaneously obtains an AM (amplitude modulation) video signal in which a RF signal is amplitude-modulated with a reproduced video signal to mix the AM video signal with a balanced modulation output. Then, a RF conversion circuit sends out the mixed signal through a band pass filter having a predetermined frequency as an RF conversion signal.

One of the RF conversion circuits of the aforementioned kind, as an FM circuit for obtaining the FM sound signal, has been disclosed in Japanese Patent Laid-Open No. 60-248008 (Japanese Patent Publication No. 4-79163). The circuit constitution of the FM circuit for realizing this is shown in FIG. 1. The FM circuit 1 outputs a sound carrier signal S1 oscillated from the LC resonance circuit 3 of a main oscillation circuit 2 as a signal S4 via a transistor Q5 and a coupling capacitor C2, and obtains a multiplication output by multiplying the signal S4 and the sound carrier signal S1 and an audio signal SA input from a sound signal input circuit 5 at a multiplication circuit 4. Then, the FM circuit 1 shifts the phase of the sound multiplication output via a phase shifting circuit 6, and then synthesizes it with the sound carrier signal S1, thereby obtaining the frequency modulation output. Then, FM circuit 1 outputs frequency-modulated signal from an output amplifier circuit 7.

The main oscillation circuit 2 connects a collector of a differential transistor Q7 out of two differential transistors Q6 and Q7 via an amplification transistor Q11 and an IC terminal T3 to the LC resonance circuit 3 composed of a coil L1 and a capacitor C1. The LC resonance circuit 3 is connected to an IC terminal T2 extending from a power source line P1, thereby sends out the sound carrier signal S1 from the LC resonance circuit 3 connected in parallel with a load resistor R6 to the side of the transistor Q11. The sound carrier signal S1 is fed through the feedback transistor Q5 and further through a coupling capacitor C2 back to the base of the other transistor Q6 by positive feedback, so that the transistors Q6 and Q7 oscillate at the oscillation frequency of the LC resonance circuit 3.

On the other hand, in the sound signal input circuit 5, the audio signal SA is input from an external terminal T4 to bases of transistors Q29 and Q30 of a differential amplifier, and is output from the collectors as sound signals S2 and S3 to the multiplication circuit 4. In the multiplication circuit 4, the sound carrier signal S4 sent from the transistors Q6 and Q7 of the main oscillation circuit 2 is amplitude-modulated by the sound signals S2 and S3, whereby an AM sound signal S5 is obtained. The AM modulation signal S5 is shifted π/2 radians by a capacitor C3, and then vector-synthesized in the emitter of the amplifier transistor Q11 with the sound carrier signal S1, so that a frequency modulation signal can be obtained.

The frequency of the sound carrier signal S1 oscillated from the LC resonance circuit 3 of the FM circuit 1 is fixed by the inductance of the coil L1, and the electrostatic capacity and the circuit impedance of the capacitor C1. For example, in the NTSC (national television system committee) method, it is set to oscillate a modulation signal of 4.5 MHz as a modulation frequency.

Incidentally, in addition to the NTSC method, various TV methods such as PAL (phase alternation by line) and the like are adopted in various regions of the world, so the sound carrier signal used in the FM circuit is set to a different frequency for each of TV systems. In Japan and the U.S., for example, the NTSC method is adopted and therefore a modulation frequency of 4.5 MHz is set. On the other hand, in European countries including U.K. and Eastern Europe, 5.5 MHz, 6.0 MHz or 6.5 MHz are employed as a modulation frequency, respectively. Therefore, in the FM circuits in which the resonance frequency of the LC resonance circuit is fixed such as the FM circuit 1 described above, there has been no interchangeability between regions in which the frequencies of the sound carrier signals are different.

Then, in order to correspond to each of modulation frequencies of these different TV methods, there has been proposed a FM circuit as shown in FIG. 2 in which a varactor diode D1 capable of varying an electrostatic capacity by voltage is combined with a coil L2 of an LC resonance circuit 8, and which makes a resonance frequency variable thereby performing modulation conversion.

However, there is a fundamental problem that the C-V (electrostatic capacity-voltage) characteristic of the varactor diode is a non linearly proportional relation. Also, there is another problem. If the amplitude of an input signal becomes large, a self-bias effect occurs which adds an oscillation signal voltage to the varactor diode, and therefore the linearity of the frequency modulation is deteriorated. Further, there is another problem that, in the cases where the bias to be supplied to the LC resonance circuit is set to 5 V or more to vary the electrostatic capacity of the varactor diode, an additional power supply is needed under the condition that the circuit such as IC is operated by 5 V, and therefore the circuit constitution becomes complicated.

SUMMARY OF THE INVENTION

In view of the foregoing, an object of this invention is to provide a frequency modulation circuit which varies the resonance frequency of an LC resonance circuit and corresponds to the frequency of all TV methods with a simple constitution.

Another object of the invention is to provide a frequency modulation circuit which constitutes a resonance circuit without a coil by passive elements to be suitable as an IC.

Further, another object of the invention is to provide a frequency modulation circuit which combines the passive elements of a switching resonance circuit depending on resistance, capacity, and the like to obtain stable oscillation output.

The foregoing objects and other objects of the invention have been achieved by the provision of a frequency modulation circuit comprising: a main oscillation circuit for generating a first signal having an oscillation frequency of an LC resonance circuit, by a differential circuit connected to the LC resonance circuit; a multiplication circuit of differential circuit constitution for multiplying the first signal by a second signal, and for forming a third signal in which the first signal is amplitude-modulated by the second signal; a phase shifting circuit for shifting a phase of the third signal by supplying the third signal to the main oscillation circuit through phase shifting means, and then synthesizing with the first signal; a plurality of passive element series circuits connected to the LC resonance circuit in parallel; and a plurality of switching means for switching and controlling the plurality of passive element series circuits and the LC resonance circuit by connecting or separating them.

The plurality of passive element series circuits for varying the time constant of the LC circuit is connected or separated to or from the LC resonance circuit by the switching means, so that the oscillation frequency of the LC resonance circuit can be switched to a predetermined frequency.

The nature, principle and utility of the invention will become more apparent from the following detailed description when read in conjunction with the accompanying drawings in which like parts are designated by like reference numerals or characters.

DETAILED DESCRIPTION OF THE DRAWINGS

In the accompanying drawings:

FIG. 4 is a table showing the relation between the connection state of each of the switches connected to the CR (capacitor-resistor) pairs shown in FIG. 3 and the resonance frequency of the FM circuit;

DETAILED DESCRIPTION OF THE PREFERRED EMBODIMENTS

Figure 1:
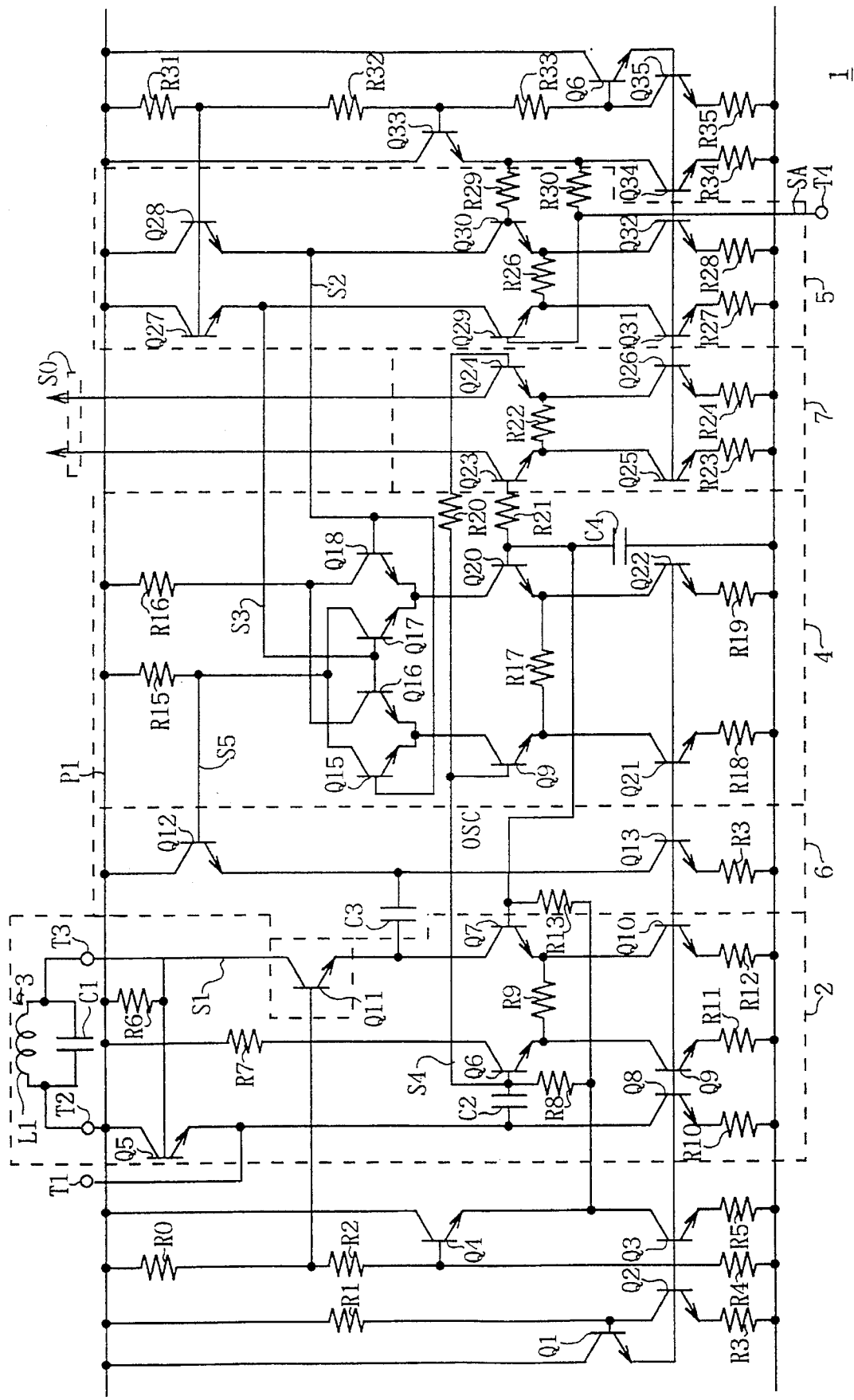
FIG. 1 is a circuit diagram showing the overall constitution of an FM circuit of the related art.
Figure 2:
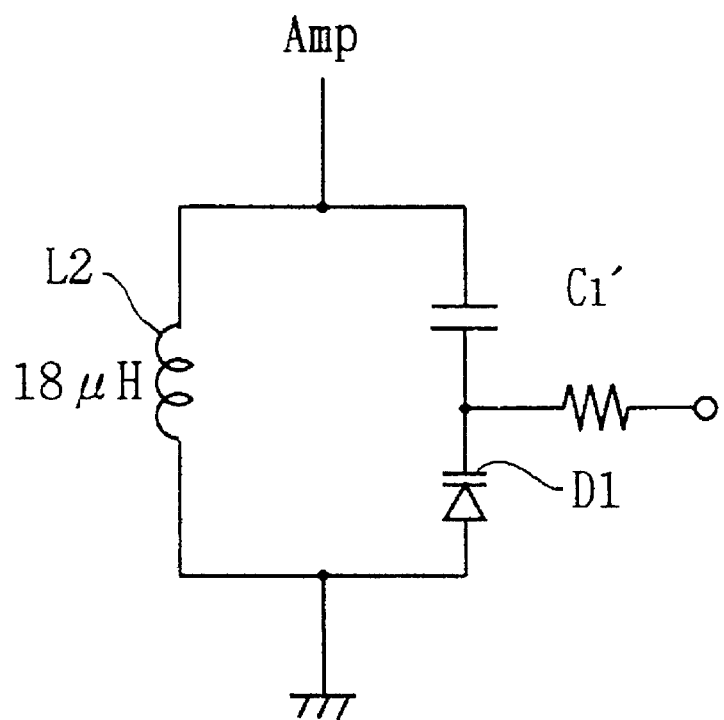
FIG. 2 is a circuit diagram showing an LC resonance circuit of the related art using a varactor diode.
Figure 3:
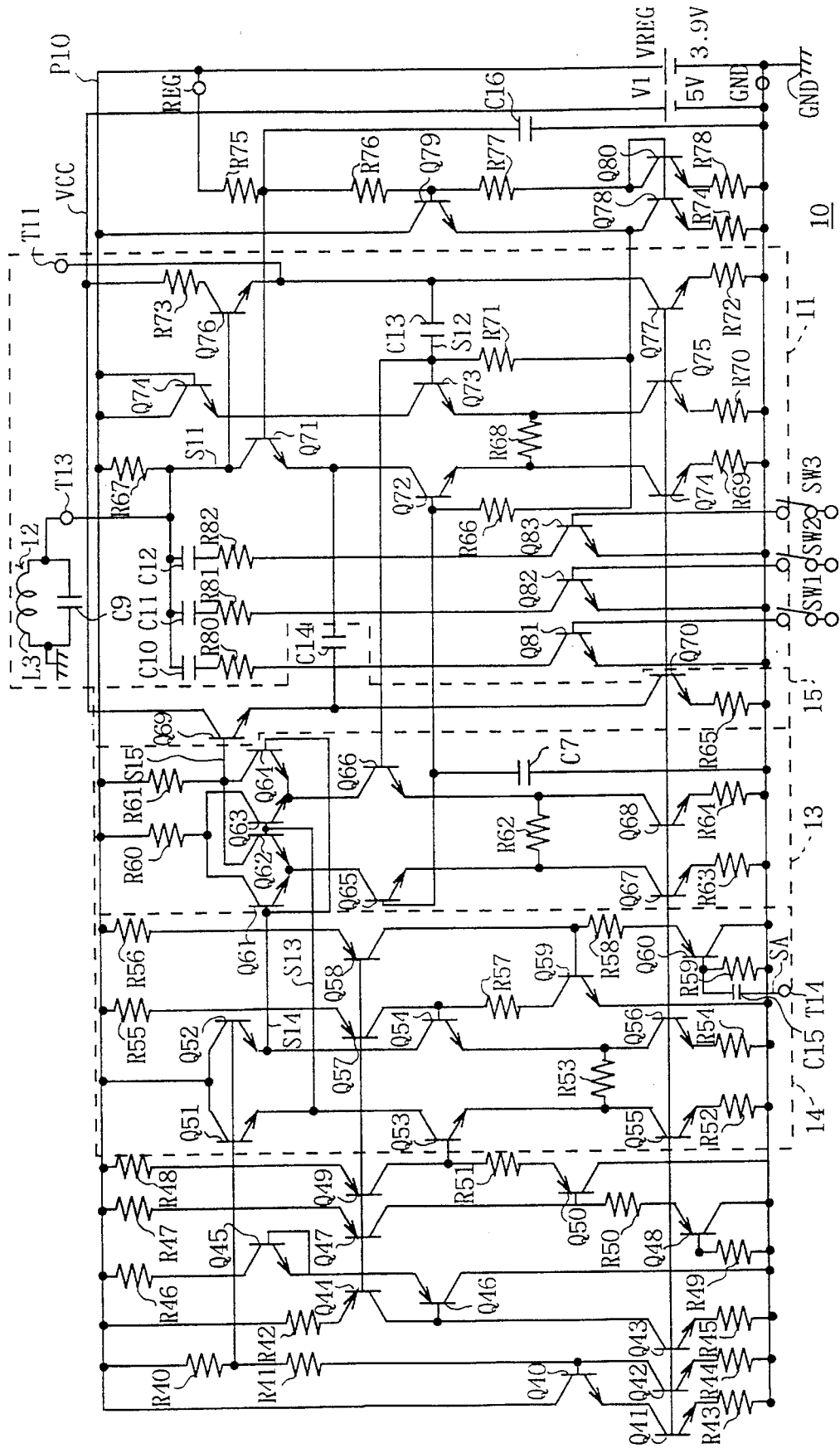
FIG. 3 is a circuit diagram showing the overall constitution of a first embodiment of the FM circuit of the present invention.

Preferred embodiments of the present invention will be described with reference to the accompanying drawings:

The first embodiment of the present invention is shown in FIG. 3. Reference numeral 10 generally refers to an FM circuit which oscillates a sound carrier signal S11 at an LC resonance circuit 12 of a main oscillation circuit 11. A multiplication output of a multiplication circuit 13 is phase shifted $\pi/2$ and added to the sound carrier signal S11. A two-phase audio signal SA is input from a sound signal input circuit 14 to differential input portions Q61, Q62, Q63, and Q64 of the multiplication circuit 13, and the sound carrier signal S11 is amplitude-modulated with this audio signal SA. The amplitude-modulated sound carrier signal S15 is phase shifted via a phase shifting circuit 15, and then is vector-synthesized with the sound carrier signal S11. In this way, the FM signal is obtained.

The main oscillation circuit 11 connects a collector of a differential transistor Q72 out of two differential transistors Q72 and Q73 via an amplifier transistor Q71 and an IC terminal T13 to the LC resonance circuit 12 composed of a coil L3 and a capacitor C9. The IC terminal T13 is connected via a resistor R67 to a constant voltage power source line P10 and the collector of the amplifier transistor Q71. Also, the IC terminal T13 is connected with three CR pairs, (C10, R80), (C11, R81), and (C12, R82), each composed of a capacitor for varying CR time constant of the LC circuit 12 and a resistor in parallel. Each of these three CR pairs is composed of a series circuit of a capacitor and a resistor. The other ends of the resistors R80, R81, and R82 are connected to the collectors of transistors Q81, Q82, and Q83, respectively. The transistors Q81, Q82, and Q83 have grounded emitters, and receive control signals from a microcomputer (not shown) via change-over switches SW1, SW2, and SW3 to their bases.

The sound carrier signal S11 oscillated from the LC resonance circuit 12 is input to the collector of the amplifier transistor Q71 and the base of a feedback transistor Q76. This sound carrier signal S11 is fed through the feedback transistor Q76 and a coupling capacitor C13 back to the base of the other transistor Q73 of the differential transistors Q72 and Q73 by a positive feedback, so that the transistors Q72 and Q73 oscillate at the resonance frequency of the LC resonance circuit 12.

The multiplication circuit 13 has differential transistors Q65 and Q66, and receives a feedback signal S12 obtained through the coupling capacitor C13 at the base of the transistor Q66. The transistors Q65 and Q66 are connected to pairs of transistors Q61 and Q62, and Q63 and Q64. The audio signal SA is input to the sound signal input circuit 14 from an IC terminal T14 via a capacitor C15 and a transistor Q60, and is supplied from differential transistors Q53 and Q54 to the multiplication circuit 13.

More particularly, a first phase sound signal S13 is input from the transistor Q53 out of two differential transistors Q53 and Q54 to the bases of the transistors Q62 and Q63 of the multiplication circuit 13, and simultaneously a second phase sound signal S14 is input from the other transistor Q54 to the bases of the transistors Q61 and Q64 of the multiplication circuit 13. As a result, the collectors of the transistors Q62 and Q64 obtain the AM sound signal S15 in which the feedback signal S12 transmitted from the transistors Q72 and Q73 of the main oscillation circuit 11 is amplitude-modulated by the sound balance signals S13 and S14. Then, the AM sound signal S15 is supplied through an emitter follower transistor Q69 of the phase shifting circuit 15 to a capacitor C14. In the capacitor C14, the AM sound signal S15 is shifted $\pi/2$, and then is synthesized with the sound carrier signal S11 in the emitter of the amplifier transistor Q71 to generate an FM signal. The FM signal is output via the feedback transistor Q76 from an IC terminal T11.

The switches SW1, SW2, and SW3 that are controlled by a microcomputer (not shown) are connected with each of the bases of the transistors Q81, Q82, and Q83 which are connected to the other ends of the CR pairs connected to the LC resonance circuit 12 of the main oscillation circuit 11, respectively. By switching the switches SW1, SW2, and SW3, control signals to be supplied to the bases of the transistors Q81, Q82, and Q83 are controlled. As a result, the transistors are controlled to turn on and off, so that the CR pairs connected to the transistors are grounded or switched to connect to the open terminals.

Figure 5A:
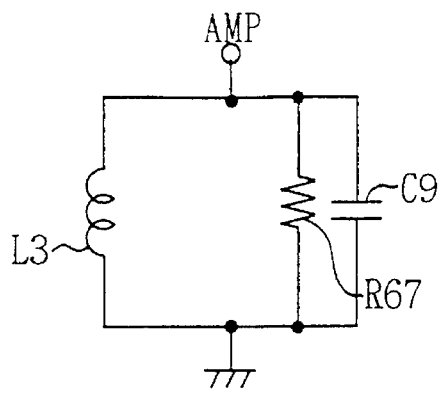
FIGS. 5A to 5D are circuit diagrams showing the constitution of the LC resonance circuit of the present invention.

In order to obtain each frequency of 6.5 MHz, 6.0 MHz, 5.5 MHz, and 4.5 MHz of the sound carrier signal, the capacitance and resistance value of each of the series connection CR pairs connected to the LC resonance circuit 12 are obtained as follows. As shown in FIG. 4, when the switches SW1, SW2, and SW3 are all off, the LC resonance circuit 12 becomes as shown FIG. 5A. And when the resonance frequency $f_1$ at this time is set to 6.5 MHz, the angular frequency $\omega$ of the resonance circuit 12 is obtained, using the resonance frequency $f_1$, by the following equation:

$$\omega = 2\pi f_1 \quad (1)$$

Further, with the angular frequency $\omega$, the capacitance $C_{01} = 33$ pF of the capacitor C9 set to obtain a stable oscillation with respect to the coil L3 having an inductance $L_{03} = 18$ μH which is connected in parallel to the LC resonance circuit 12, and a value "Q" representative of a sharpness of resonance set to a predetermined value 9, the resistance value $r_0$ of the resistor R67 connected to the resonance circuit 12 is obtained by the following equation:

$$r_0 = \frac{Q}{\omega C_{01}} \quad (2)$$

And the obtained value is $r_0 = 6.68$ kΩ.

Figure 5B:
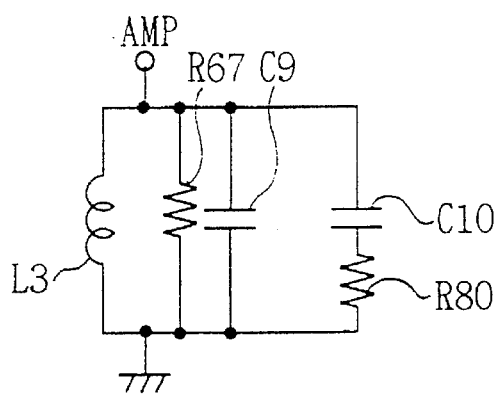

Next, when only the switch SW1 is turned on with respect to the LC resonance circuit 12 to which CR pairs have not been connected, the LC resonance circuit 12 becomes as shown in FIG. 5B. In the case where the resonance frequency $f_2$ is set to 6.0 MHz, the CR pair of parallel circuit is converted to the CR pair of series circuit by a Y-Z conversion by using the capacitance $C_{02}'$ of the capacitor and the resistance value $r_1'$ of the resistor, both of which construct the CR pair of parallel circuit. Therefore, it is possible to set the capacitance $C_{02}$ and the resistance value $r_1$ of the CR pair (C10, R80) of a series circuit which are connected to the resonance circuit when turning on the switch SW1.

That is, the angular frequency $\omega$ is obtained, using the resonance frequency $f_2$, by the following equation:

$$\omega = 2\pi f_2 \quad (3)$$

Further, the capacitance $C_{10}'$ of the overall resonance circuit is obtained by substituting the capacitance $C_{02}' = 6.0$ pF of the capacitor newly connected in parallel to the resonance circuit and the capacitance $C_{01} = 33$ pF of the capacitor which already exists in the resonance circuit into the following equation:

$$C_{10}' = C_{01} + C_{02}' \quad (4)$$

At this time, if the Q value of the oscillation frequency is set to a constant value "9", the resistance value $r_1'$ newly added to the LC resonance circuit 12 is obtained, using this capacitance $C_{10}'$ and the angular frequency $\omega$, by the following equation:

$$r_1' = \frac{Q}{\omega C_{10}'} \quad (5)$$

Further, the total resistance $R_1$ of the resistance value $r_1'$ and the resistance value $r_0$ of the resistor already connected in the resonance circuit which are connected in parallel is calculated by the following equation:

$$R_1 = \frac{r_0 r_1'}{r_0 + r_1'} \quad (6)$$

Further, using the resistance value $R_1$, the capacitance $C_{10}'$ of the capacitor, and the angular frequency $\omega$, the following equations can be effected:

$$C_{10}' = \frac{C_{10}}{(r_1 \omega C_{10})^2 + 1} \quad (7)$$

$$R_1 = \frac{r_1^2 \omega^2 C_{10}^2 + 1}{r_1 \omega^2 C_{10}^2} \quad (8)$$

Then, Y-Z conversion is performed by using the results of equations (7) and (8). Further, it is possible to set the capacitance $C_{02}$ of the capacitor $C_{10}$ and resistance value $r_1$ of the resistor R80 of the CR pair (C10, R80) of a series circuit to be connected to the resonance circuit, respectively, using the following equation:

$$C_{10} = C_{01} + C_{02} \quad (9)$$

Figure 5C:
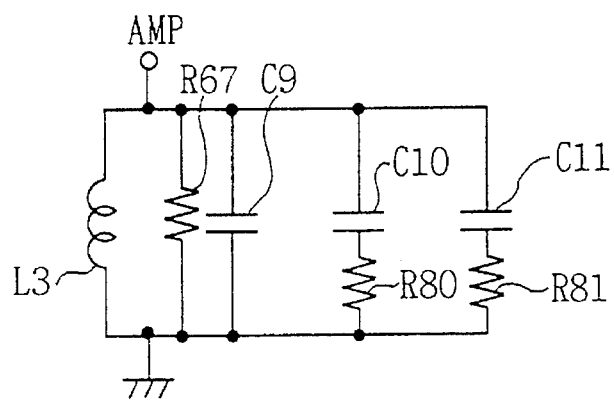

In the case where the switches SW1 and SW2 are turned on, the LC resonance circuit 12 becomes as shown in FIG. 5C. When the resonance frequency $f_2$ is set to 5.5 MHz, the CR pair to be connected to the resonance circuit by turning the switch SW2 on is converted into the CR pair (C11, R81) of a series circuit by Y-Z conversion with the use of the capacitance $C_{03}'$ and resistance value $r_2'$ of the CR pair of a parallel circuit. Therefore, the capacitance $C_{03}$ and resistance value $r_2$ of the CR pair (C11, R81) of a series circuit are set.

First, the angular frequency $\omega$ is obtained using a resonance frequency $f_3$, by the following equation:

$$\omega = 2\pi f_3 \quad (10)$$

Further, the capacitance $C_{20}'$ of the overall resonance circuit is obtained by substituting the capacitance $C_{03}' = 7.5$ pF of the capacitor newly connected in parallel to the resonance circuit and the capacitance $C_{10} = 39$ pF of the LC the resonance circuit 12 as the switch SW1 is turned on into the following equation:

$$C_{20}' = C_{10} + C_{03}' \quad (11)$$

Next, the resistance value $r_2'$ of the LC resonance circuit for setting the Q value of the resonance circuit to a constant value "9" is obtained using the capacitance $C_{20}'$ and the angular frequency $\omega$, by the following equation:

$$r_2' = Q/\omega C_{20}' \quad (12)$$

Further, the total resistance $R_2$ as the resistance value $r_2'$ and the resistance values $r_0$ and $r_1$ of the resistors R67 and R80 already connected in the resonance circuit which are connected in parallel is obtained by the following equation:

$$R_2 = \frac{r_0 r_1 r_2'}{r_1 r_2' + r_1 r_0 + r_0 r_2'} \quad (13)$$

Further, using the resistance value $R_2$, the capacitance $C_{03}'$ of the capacitor, and the angular frequency $\omega$, the following equations can be effected:

$$C_{20}' = \frac{C_{20}}{(r_2\omega C_{20})^2 + 1} \quad (14)$$

$$R_2 = \frac{r_2^2\omega^2 C_{20}^2 + 1}{r_2\omega^2 C_{20}^2} \quad (15)$$

By using the results of equations (14) and (15), Y-Z conversion is performed. Further, it is possible to set the capacitance $C_{03}$ of the capacitor C11 and resistance value $r_2$ of the resistor R81 of the CR pair (C11, R81) of a series circuit that are connected to the resonance circuit by turning the switch SW2 on, using the following equation:

$$C_{20} = C_{10} + C_{03} \quad (16)$$

Figure 5D:
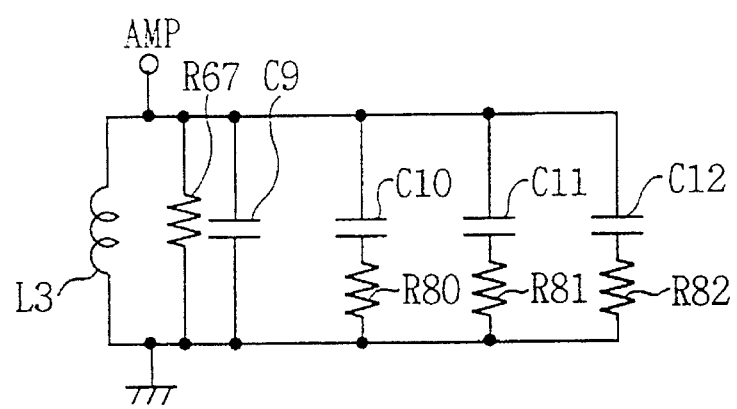

Further, when the switches SW1, SW2, and SW3 are turned on at the same time, the LC resonance circuit 12 becomes as shown in FIG. 5D. When the resonance frequency $f_4$ is set to 4.5 MHz, the CR pair to be connected to the resonance circuit by turning the switch SW3 on is converted into the CR pair (C12, R82) of a series circuit by Y-Z conversion with the use of the capacitance $C_{04}'$ and resistance value $r_3'$ of a CR pair of a parallel circuit. Therefore, the electrostatic capacity $C_{04}$ and resistance value $r_3$ of the CR pair (C12, R82) of the series circuit are set.

First, the angular frequency $\omega$ is obtained using the resonance frequency $f_4$, by the following equation:

$$\omega = 2\pi f_4 \quad (17)$$

Further, the capacitance $C_{30}'$ of the overall resonance circuit is obtained by substituting the electrostatic capacity $C_{04}'=22.5$ pF of the capacitor newly connected in parallel to the resonance circuit and the capacitance $C_{20}=46.5$ pF of the LC resonance circuit 12 as the switches SW1 and SW2 are turned on into the following equation:

$$C_{30}' = C_{20} + C_{04}' \quad (18)$$

Next, the resistance value $r_3'$ of the LC resonance circuit for setting the Q value of the resonance circuit to a constant value "9" is obtained, using this capacitance $C_{30}'$ and the angular frequency $\omega$, by the following equation:

$$r_3' = \frac{Q}{\omega C_{30}'} \quad (19)$$

Further, the total resistance $R_3$ of the resistance value $r_3'$ and the resistance values $r_0$, $r_1$ and $r_2$ of the resistors already connected in the resonance circuit which are connected in parallel is obtained by the following equation:

$$R_3 = \frac{r_0 r_1 r_2 r_3'}{r_0 r_2 r_3' + r_1 r_2 r_3' + r_0 r_1 r_2 + r_0 r_1 r_3'} \quad (20)$$

Further, using this resistance value R3, the capacitance $C_{04}'$ of the capacitor, and the angular frequency $\omega$, the following equations are effected:

$$C_{30}' = \frac{C_{30}}{(r_3\omega C_{30})^2 + 1} \quad (21)$$

$$R_3 = \frac{r_3^2\omega^2 C_{30}^2 + 1}{r_3\omega^2 C_{30}^2} \quad (22)$$

By using the results of equations (21) and (22), Y-Z conversion is performed. Further, there can be set the capacitance $C_{04}$ of the capacitor C12 and resistance value $r_3$ of the resistor R82 of the CR pair (C12, R82) of a series circuit that are connected to the resonance circuit, using the following equation:

$$C_{30} = C_{20} + C_{04} \quad (23)$$

In the constitution described above, the sound carrier signal S11 oscillated from the main oscillation circuit 11 is amplitude-modulated in the multiplication circuit 13 by the sound signals S13 and S14 input from the sound signal input circuit 14. That is, the AM sound signal S15 obtained via the capacitor C14 of the phase shifting circuit 15 varies in amplitude according to the sound signal, and has the same frequency and a phase difference of $\pi/2$ with respect to the feedback signal of the transistor Q73. Therefore, an FM signal, in which the positive feedback signal S11 and the AM sound signal S15 are vector-synthesized, is obtained on the collector side of the amplification transistor Q71.

Here, the CR pairs (C10, R80), (C11, R81), and (C12, R82) to be connected to the LC resonance circuit 12 are selected by switching the switches SW1, SW2, and SW3 of the main oscillation circuit 11. Thereby, the time constant of the LC resonance circuit 12 is switched, and the resonance frequency of the LC resonance circuit 12 is varied to one of these values: $f_1=6.5$ MHz, $f_2=6.0$ MHz, $f_3=5.5$ MHz, or $f_4=4.5$ MHz. As a result, in TV methods different in the frequency of the sound carrier signal, the frequency modulation of the sound signal can be performed by selecting the frequency of the sound carrier signal to be used in the frequency modulation according to the respectively different frequencies of the sound carrier signal.

Figure 6:
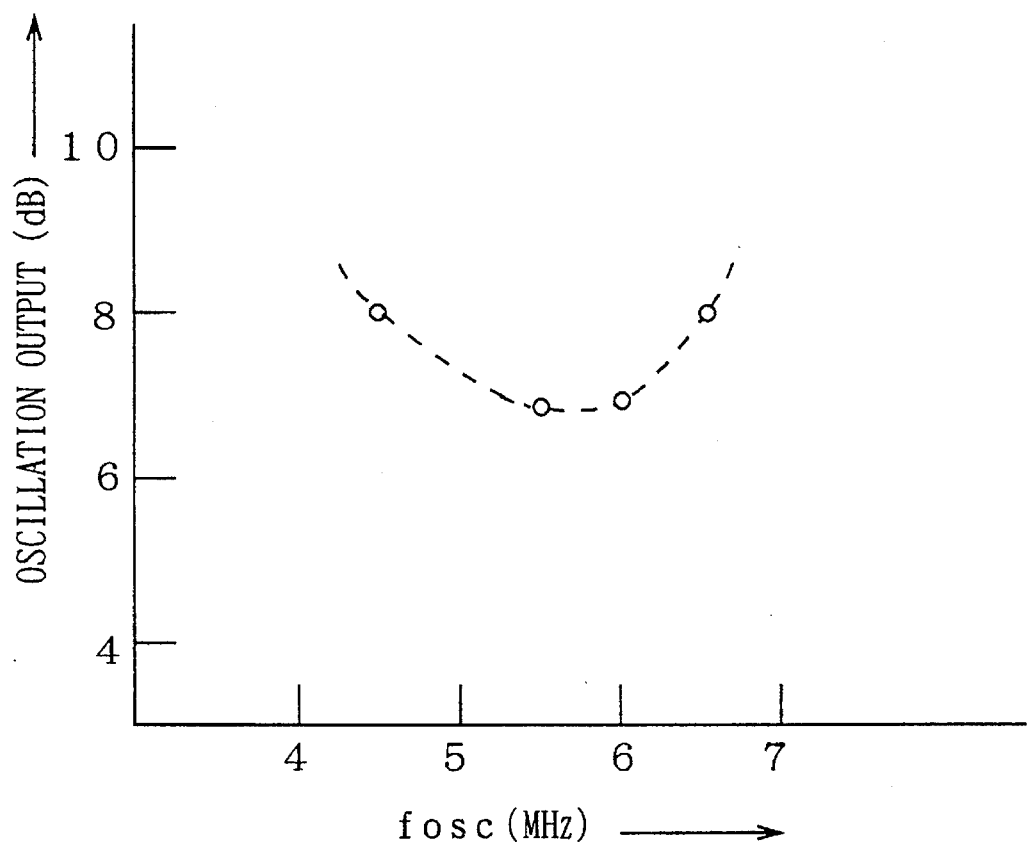
FIG. 6 is a graph explaining the modulation frequency and oscillation output in the FM circuit.

In accordance with the constitution described above, a plurality of CR pairs that can be connected to or disconnected from a phase shifter type of oscillation apparatus is switched to connect or separate by the switches SW1, SW2, and SW3, so that the frequency of the sound carrier signal used for the frequency modulation can easily be switched to a desired frequency. In this case, it is no problem that the distortion in the oscillation frequency signal occurs by a self-bias as in the case of using a varactor diode. Further, when varying the resonance frequency of the LC resonance circuit, the Q value is set to a constant value of "9", varying the capacitance of the CR pair, so that, as shown in FIG. 6, the oscillation outputs which are frequency-modulated by the frequencies 4.5 MHz, 5.5 MHz, 6.0 MHz, and 6.5 MHz of the sound carrier signal of each TV method can be made substantially the same level. As a result, a stable frequency modulation is performed. In addition, an external bias power source is unnecessary, so that external components can be reduced in number.

Further, since the CR pair composed of the capacitor and the resistor which is connected to the LC resonance circuit 12 is made a series connection of a capacitor and a resistor, the resistance value can be reduced. Therefore, occupied areas of resistors in the circuit can be reduced and the CR pair can be constructed in the IC more easily.

Figures 7, 8:
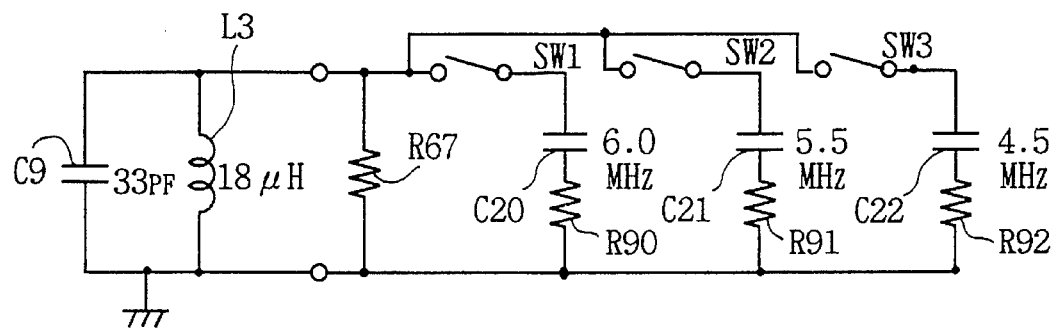
FIG. 7 is a circuit diagram showing a second embodiment of an LC resonance circuit of the present invention.
FIG. 8 is a table showing the relation between the connection state of each of the switches connected to the CR pairs of the second embodiment and the resonance frequency.

Furthermore, in the embodiment described above, when varying the CR time constant of the LC resonance circuit 12 to correspond to each frequency of sound carrier signal, the CR pairs are sequentially connected to lower the resonance frequency, so that a plurality of capacitors of each CR pair are combined, and the capacitance of the resonance circuit is increased by the total capacitance of the connected capacitors of the CR pairs. However, the present invention is not only limited to this, but, as shown in FIG. 7, the capacitance of the resonance circuit can be set with only the capacitor of each CR pair which is described as the second embodiment of the present invention.

More particularly, in an LC resonance circuit 20, switch transistors Q81, Q82, and Q83 shown in FIG. 3 are respectively connected to the other ends of CR pairs of (C20, R90), (C21, R91), and (C22, R92). The capacitance and resistance value of each of the CR pairs is set as follows; the capacitor C20 is set to 6.02 pF, the resistor R90 to 267Ω, the capacitor C21 to 13.5 pF, the resistor R91 to 132Ω, the capacitor C22 to 36.16 pF, and the resistor R92 to 64.9Ω.

A the third embodiment of the present invention is described as follows.

Figures 9A, 9B:
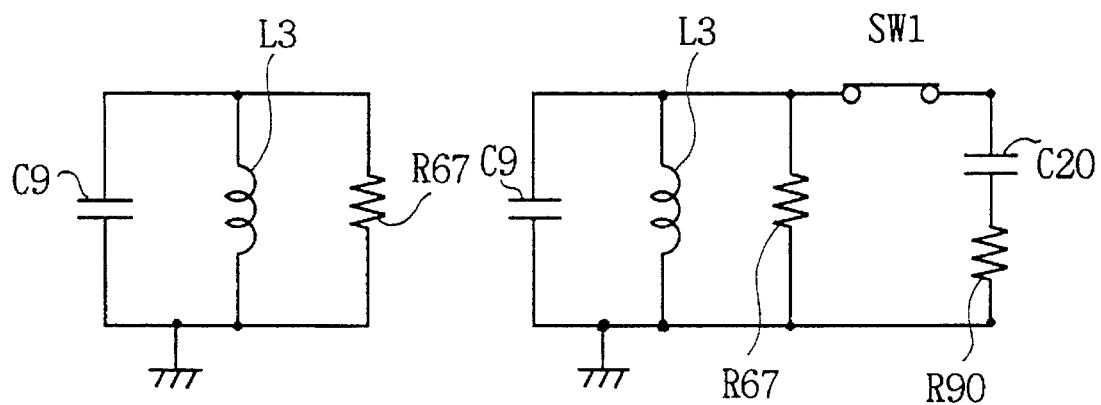
FIGS. 9A, 9B, 10A and 10B are circuit diagrams explaining the LC resonance circuit of a third embodiment.

The resonance frequency of the LC resonance circuit 20 described above can be changed by controlling the switch transistors Q81, Q82, and Q83 shown in FIG. 3 which are connected to the CR pairs by a control signal from a microcomputer, and then turning on or off the switch transistors corresponding to the respective resonance frequencies. More particularly, as shown in FIG. 8, all the switches SW1, SW2, and SW3 turn off when the frequency of the sound carrier signal is 6.5 MHz, so that the capacitance and resistance of the LC resonance circuit 20 become 33 pF and 6.68 kΩ (FIG. 9A). As a result, the Q value can be set to "9" with respect to the resonance frequency of 6.5 MHz.

Figure 10A:
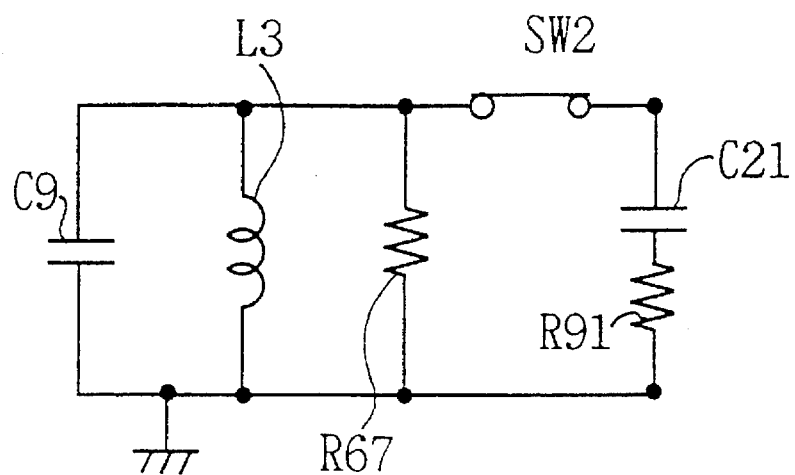

Also, when the resonance frequency is 6.0 MHz, the capacitance C20 and resistor R90 of the CR pair connected to the LC resonance circuit 20 become 36.16 pF and 64.9Ω (FIG. 9B) by turning only the switch SW1 on, so that the Q value can be set to "9" with respect to the resonance frequency of 6.0 MHz. Further, when the resonance frequency is 5.5 MHz, the capacitance C21 and the resistor R91 of the CR pair connected to the LC resonance circuit 20 become 13.5 pF and 132Ω (FIG. 10A) by turning only the switch SW2 on, so that the Q value can be set to "9" with respect to the resonance frequency of 5.5 MHz.

Figure 10B:
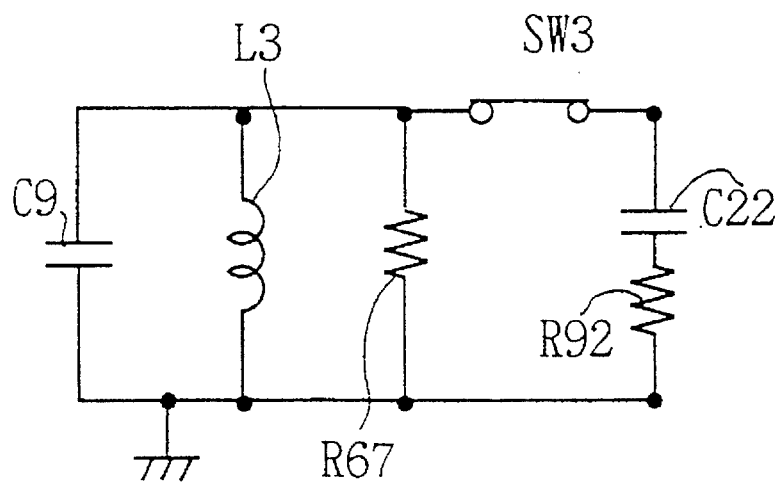

Further, when the resonance frequency is 4.5 MHz, the capacitance C22 and the resistor R92 of the CR pair connected to the LC resonance circuit 20 become 6.02 pF and 267Ω (FIG. 10B) by turning only the switch SW3 on, so that the Q value can be set to "9" with respect to the resonance frequency of 4.5 MHz. Thus, even if the CR pair for varying the CR time constant is separately connected corresponding to each resonance frequency, the capacitance of the LC resonance circuit 20 can be varied. Therefore, by setting the Q value of each frequency at the time of oscillating to "9", a stable oscillation output can be obtained.

In the present invention described above, a plurality of passive element series circuits and switching means for varying the time constant of the LC resonance circuit are provided, and the passive element series circuits connected to or separated from the LC resonance circuit is switched by the switching means, so that a frequency modulation circuit can be realized which can easily vary the resonance frequency of the LC resonance circuit.

Furthermore, the passive element series circuit is composed of the capacitor and the resistor, and the transistor is used for the switching element for switching this series circuit, so that the frequency modulation circuit can be an IC. As a result, it is possible to cut the cost.

While there have been described preferred embodiments of the invention, it will be obvious to those skilled in the art that various changes and modifications may be made. Therefore, it is desired to cover in the appended claims all such changes and modifications as fall within the true spirit and scope of the invention.

What is claimed is:

1. A variable frequency modulation circuit, comprising:

a main oscillation circuit for generating a first signal having an oscillation frequency of an LC resonance circuit, including a differential circuit connected to said LC resonance circuit;

a multiplication circuit having the constitution of a differential circuit for forming a third signal generated by multiplying a second signal with said first signal and amplitude-modulating said first signal with said second signal;

a circuit for shifting a phase of said third signal by supplying said third signal to said main oscillation circuit through phase shifting means, and then synthesizing the phase-shifted signal with said first signal;

a plurality of passive element series circuits connected to said LC resonance circuit in parallel; and a plurality of switching means for switching and controlling by connecting or separating said plurality of passive element series circuits and said LC resonance circuit.

2. A variable frequency modulation circuit, comprising:

a main oscillation circuit for generating a first signal having an oscillation frequency of an LC resonance circuit, including a differential circuit connected to said LC resonance circuit;

a multiplication circuit having the constitution of a differential circuit for forming a third signal generated by multiplying a second signal with said first signal and amplitude-modulating said first signal with said second signal;

a circuit for shifting a phase of said third signal by supplying said third signal to said main oscillation circuit through phase shifting means, and then synthesizing the phase-shifted signal with said first signal;

a plurality of passive element series circuits connected to said LC resonance circuit in parallel;

a plurality of switching means for switching and controlling by connecting or separating said plurality of passive element series circuits and said LC resonance circuit; and control means for switching the combination of said plurality of passive element series circuits connected to said LC resonance oscillation circuit.

3. The variable frequency modulation circuit according to claim 1 or 2, wherein said plurality of passive element series circuits each comprise a capacitor and a resistor.

4. The variable frequency modulation circuit according to claim 3, wherein a Q (quality factor) value of a resonance circuit of said main oscillation circuit is set to a desired value by connecting or separating said plurality of passive element series circuits to or from said LC resonance circuit.

5. The variable frequency modulation circuit according to claim 1 or 2, wherein a resonance frequency of said LC resonance circuit, which is switched by connecting or separating said plurality of passive element series circuits with the use of said switching means, is 4.5 MHz, 5.5 MHz, 6.0 MHz, and 6.5 MHz.

6. The variable frequency modulation circuit according to claim 1 or 2, wherein said plurality of switching means are connected to said plurality of passive element series circuits in series.

7. The variable frequency modulation circuit according to claim 6, wherein said passive element series circuits each comprise a resistor and a capacitor, and said plurality of switching means comprise bipolar transistors.

* * * * *